US010350865B2

(12) United States Patent
Pawlik et al.

(10) Patent No.: US 10,350,865 B2
(45) Date of Patent: Jul. 16, 2019

(54) MULTILAYER FILM WITH POLYAMIDE AND POLYESTER LAYERS FOR THE PRODUCTION OF PHOTOVOLTAIC MODULES

(71) Applicants: Andreas Pawlik, Recklinghausen (DE); Martin Wielpuetz, Senden (DE); Harald Haeger, Luedinghausen (DE)

(72) Inventors: Andreas Pawlik, Recklinghausen (DE); Martin Wielpuetz, Senden (DE); Harald Haeger, Luedinghausen (DE)

(73) Assignee: Evonik Degussa GmbH, Essen (DE)

( * ) Notice: Subject to any disclaimer, the term of this patent is extended or adjusted under 35 U.S.C. 154(b) by 665 days.

(21) Appl. No.: 13/649,616

(22) Filed: Oct. 11, 2012

(65) Prior Publication Data
US 2013/0092233 A1  Apr. 18, 2013

(30) Foreign Application Priority Data
Oct. 14, 2011  (DE) ........................ 10 2011 084 518

(51) Int. Cl.
*H01L 31/05* (2014.01)
*B32B 27/36* (2006.01)
*B32B 27/08* (2006.01)
*B32B 27/34* (2006.01)
*B32B 7/12* (2006.01)
*H01L 31/049* (2014.01)

(52) U.S. Cl.
CPC ............... *B32B 27/36* (2013.01); *B32B 7/12* (2013.01); *B32B 27/08* (2013.01); *B32B 27/34* (2013.01); *H01L 31/049* (2014.12); *B32B 2250/24* (2013.01); *B32B 2270/00* (2013.01); *B32B 2457/12* (2013.01); *Y02E 10/50* (2013.01); *Y10T 428/24975* (2015.01); *Y10T 428/269* (2015.01); *Y10T 428/31725* (2015.04); *Y10T 428/31736* (2015.04)

(58) Field of Classification Search
CPC ... H01L 31/049; H01L 31/0481; B32B 27/34; B32B 27/36
See application file for complete search history.

(56) References Cited

U.S. PATENT DOCUMENTS

| | | | |
|---|---|---|---|
| 5,932,686 A | 8/1999 | Hoff | |
| 6,355,358 B1 | 3/2002 | Böer et al. | |
| 6,391,982 B1 | 5/2002 | Haeger et al. | |
| 6,538,073 B1* | 3/2003 | Oenbrink et al. | ............ 525/420 |
| 6,794,048 B2 | 9/2004 | Schmitz et al. | |
| 6,861,540 B2 | 3/2005 | Herwig et al. | |
| 7,175,896 B2 | 2/2007 | Schmitz et al. | |
| 7,608,738 B2 | 10/2009 | Herwig et al. | |
| 8,022,201 B2 | 9/2011 | Roos et al. | |
| 8,048,504 B2 | 11/2011 | Schmitz et al. | |
| 8,133,561 B2 | 3/2012 | Schmitz et al. | |
| 8,168,841 B2 | 5/2012 | Herwig et al. | |
| 8,221,890 B2 | 7/2012 | Schmitz et al. | |
| 8,232,333 B2 | 7/2012 | Haeger et al. | |
| 8,372,595 B2 | 2/2013 | Schaffer et al. | |
| 8,378,127 B2 | 2/2013 | Dingerdissen et al. | |
| 8,445,720 B2 | 5/2013 | Hannen et al. | |
| 8,604,227 B2 | 12/2013 | Petrat et al. | |
| 8,871,862 B2 | 10/2014 | Pawlik et al. | |
| 9,000,223 B2 | 4/2015 | Micoine et al. | |
| 2002/0120076 A1* | 8/2002 | Schueler et al. | ............. 525/425 |
| 2003/0157350 A1* | 8/2003 | Ueyama et al. | ........... 428/474.4 |
| 2004/0013833 A1* | 1/2004 | Lee et al. | ..................... 428/35.7 |
| 2004/0023049 A1* | 2/2004 | Fujita et al. | ............... 428/474.7 |
| 2006/0083882 A1* | 4/2006 | Schmitz et al. | ........... 428/36.91 |
| 2008/0216889 A1* | 9/2008 | Blong | ..................... B32B 27/08 |
| | | | 136/251 |

(Continued)

FOREIGN PATENT DOCUMENTS

CA  2782097 A1  6/2011
EP  0 837 088 A1  4/1998

(Continued)

OTHER PUBLICATIONS

Hu et al, Improving gas barrier of PET by blending with aromatic polyamides, 2005, Polymer, vol. 46 pp. 2685-2698.*
U.S. Appl. No. 12/303,161, filed Apr. 6, 2009, US2010/0068773 A1, Marx, et al.
U.S. Appl. No. 12/517,923, filed Jun. 5, 2009, US2011/0039313 A1, Verseck, et al.
U.S. Appl. No. 12/593,090, filed Mar. 26, 2010, US2010/0190224 A1, Poetter, et al.
U.S. Appl. No. 12/602,593, filed Mar. 19, 2010, US2010/0291644 A1, Marx, et al.

(Continued)

*Primary Examiner* — Bethany L Martin
(74) *Attorney, Agent, or Firm* — Oblon, McClelland, Maier & Neustadt, L.L.P.

(57) ABSTRACT

A multilayer film containing layers of polyamide and polyester, suitable as a back cover for a photovoltaic module is provided. The film comprises, in the order listed: a) a layer which comprises at least 35% by weight of polyamide; c) a layer which comprises at least 35% by weight, of a thermoplastic polyester; and e) a layer which comprises at least 35% by weight of polyamide; wherein the layers a) and e) further comprise 0.1 to 60% by weight, of a polyamine-polyamide graft copolymer, or the layer c) further comprises 0.1 to 30% by weight of polyamine-polyamide graft copolymer. The polyamine-polyamide graft copolymer comprises as copolymerized monomers: a polyamine having at least 4 nitrogen atoms and at least one polyamide-forming unit selected from the group consisting of a lactam, an ω-aminocarboxylic acid and an equimolar combinations of a diamine and a dicarboxylic acid. In another embodiment, adhesion promoting layers are placed between the layers.

14 Claims, No Drawings

(56) References Cited

U.S. PATENT DOCUMENTS

| | | | |
|---|---|---|---|
| 2009/0151774 A1* | 6/2009 | Depine | B32B 27/06 136/251 |
| 2010/0059105 A1* | 3/2010 | Muckenhuber | 136/251 |
| 2010/0068773 A1 | 3/2010 | Marx et al. | |
| 2010/0119841 A1 | 5/2010 | Muckenhuber | |
| 2010/0190224 A1 | 7/2010 | Poetter et al. | |
| 2010/0261237 A1 | 10/2010 | Verseck et al. | |
| 2010/0291644 A1 | 11/2010 | Marx et al. | |
| 2010/0324257 A1 | 12/2010 | Karau et al. | |
| 2011/0039313 A1 | 2/2011 | Verseck et al. | |
| 2011/0083716 A1* | 4/2011 | Meakin | H01L 31/048 136/244 |
| 2011/0100438 A1* | 5/2011 | Gaston | C08L 23/12 136/252 |
| 2011/0114172 A1* | 5/2011 | Nakada et al. | 136/256 |
| 2011/0118433 A1 | 5/2011 | Pötter et al. | |
| 2011/0118504 A1 | 5/2011 | Haas et al. | |
| 2011/0171702 A1 | 7/2011 | Reinecke et al. | |
| 2011/0189742 A1 | 8/2011 | Haas et al. | |
| 2011/0251399 A1 | 10/2011 | Dingerdissen et al. | |
| 2011/0257429 A1 | 10/2011 | Schraven et al. | |
| 2012/0028060 A1 | 2/2012 | Etzel et al. | |
| 2012/0034665 A1 | 2/2012 | Haas et al. | |
| 2012/0041216 A1 | 2/2012 | Sieber et al. | |
| 2012/0245375 A1 | 9/2012 | Hannen et al. | |
| 2012/0264182 A1 | 10/2012 | Reinecke et al. | |
| 2012/0264877 A1 | 10/2012 | Häger et al. | |
| 2013/0052700 A1 | 2/2013 | Poetter et al. | |
| 2013/0092233 A1 | 4/2013 | Pawlik et al. | |
| 2013/0130319 A1 | 5/2013 | Schaffer et al. | |
| 2013/0165672 A1 | 6/2013 | Klasovsky et al. | |
| 2013/0165685 A1 | 6/2013 | Hannen et al. | |
| 2013/0171388 A1 | 7/2013 | Pawlik et al. | |
| 2013/0183725 A1 | 7/2013 | Poetter et al. | |
| 2013/0207050 A1 | 8/2013 | Hermasch et al. | |
| 2013/0240799 A1 | 9/2013 | Haeger et al. | |
| 2013/0245276 A1 | 9/2013 | Klasovsky et al. | |
| 2013/0299750 A1 | 11/2013 | Hermasch et al. | |
| 2013/0331580 A1 | 12/2013 | Klasovsky et al. | |
| 2014/0141478 A1 | 5/2014 | Schaffer et al. | |
| 2014/0178948 A1 | 6/2014 | Schaffer et al. | |

FOREIGN PATENT DOCUMENTS

| | | |
|---|---|---|
| EP | 1 065 048 A2 | 1/2001 |
| EP | 1 217 039 A2 | 6/2002 |
| EP | 1 217 039 A3 | 6/2002 |
| EP | 1 645 409 A1 | 4/2006 |
| EP | 2 422 976 A1 | 2/2012 |
| WO | WO 2008/138022 A1 | 11/2008 |
| WO | WO 2011/066595 A1 | 6/2011 |

OTHER PUBLICATIONS

U.S. Appl. No. 12/679,488, filed Mar. 23, 2010, US2010/0261237 A1, Verseck, et al.
U.S. Appl. No. 12/742,318, filed May 11, 2010, US2010/0324257 A1, Karau, et al.
U.S. Appl. No. 13/001,204, filed Dec. 23, 2010, US2011/0171702 A1, Reinecke, et al.
U.S. Appl. No. 13/002,519, filed Jan. 4, 2011, US2011/0189742 A1, Haas, et al.
U.S. Appl. No. 13/054,002, filed Jan. 13, 2011, US2011/0118504 A1, Haas, et al.
U.S. Appl. No. 13/143,354, filed Jul. 6, 2011, US2012/0041216 A1, Sieber, et al.
U.S. Appl. No. 13/141,456, filed Jun. 22, 2011, US2011/0257429 A1, Schraven, et al.
U.S. Appl. No. 13/263,761, filed Oct. 10, 2011, US2012/0034665 A1, Haas, et al.
U.S. Appl. No. 13/500,041, filed Apr. 3, 2012, US2012/0264182 A1, Reinecke, et al.
U.S. Appl. No. 12/943,145, filed Nov. 10, 2010, US2011/0118433 A1, Pötter, et al.
U.S. Appl. No. 13/764,996, filed Feb. 12, 2013, US2013/0183725 A1, Poetter, et al.
U.S. Appl. No. 13/806,555, filed Mar. 11, 2013, US2013/0165685 A1, Hannen, et al.
U.S. Appl. No. 13/642,412, filed Jan. 2, 2013, US2013/0052700 A1, Poetter, et al.
U.S. Appl. No. 13/812,625, filed Jan. 28, 2013, US2013/0130319 A1, Schaffer, et al.
U.S. Appl. No. 13/820,803, filed Mar. 5, 2013, US2013/0165672 A1, Klasovsky, et al.
U.S. Appl. No. 13/989,419, filed May 24, 2013, US2013/0245276 A1, Klasovsky, et al.
U.S. Appl. No. 14/000,400, filed Aug. 20, 2013, US2013/0331580 A1, Klasovsky, et al.
U.S. Appl. No. 14/126,607, filed Dec. 16, 2013, Haas, et al.
U.S. Appl. No. 13/424,548, filed Mar. 20, 2012, US2012/0245375 A1, Hannen, et al.
U.S. Appl. No. 14/233,505, filed Jan. 17, 2014, Poetter, et al.
U.S. Appl. No. 14/237,121, filed Feb. 4, 2014, Haas, et al.
U.S. Appl. No. 14/238,576, filed Feb. 12, 2014, Schaffer, et al.
U.S. Appl. No. 14/238,591, filed Feb. 12, 2014, Schaffer, et al.
U.S. Appl. No. 13/649,616, filed Oct. 11, 2012, Pawlik, et al.
U.S. Appl. No. 13/649,319, filed Oct. 11, 2012, Pawlik, et al.
U.S. Appl. No. 13/649,498, filed Oct. 11, 2012, Pawlik, et al.
U.S. Appl. No. 13/649,379, filed Oct. 11, 2012, Pawlik, et al.
U.S. Appl. No. 13/649,562, filed Oct. 11, 2012, Pawlik, et al.
Search Report dated Mar. 15, 2013 in European Application No. 12187605.6 (With English Translation of Category of Cited Documents).
U.S. Appl. No. 14/384,301, filed Sep. 10, 2014, Schaffer, et al.
U.S. Appl. No. 14/390,133, filed Oct. 2, 2014, Hennemann, et al.
U.S. Appl. No. 14/395,666, filed Oct. 20, 2014, Haas, et al.
U.S. Appl. No. 14/363,178, filed Jun. 5, 2014, Haas, et al.
U.S. Appl. No. 14/363,165, filed Jun. 5, 2014, Pfeffer, et al.
U.S. Appl. No. 14/367,610, filed Jun. 20, 2014, Haas, et al.
U.S. Appl. No. 14/373,089, filed Jul. 18, 2014, Engel, et al.
U.S. Appl. No. 14/380,483, filed Aug. 22, 2014, Schiemann, et al.
U.S. Appl. No. 13/494,082, filed Jun. 12, 2012, US2012/0264877 A1, Häger et al.
U.S. Appl. No. 13/140,921, filed Jun. 20, 2011, US2011/0251399 A1, Dingerdissen et al.
U.S. Appl. No. 13/882,689, filed Jul. 15, 2013, US2013/0299750 A1, Hermasch et al.
U.S. Appl. No. 13/882,799, filed May 1, 2013, US2013/0207050 A1, Hermasch et al.
U.S. Appl. No. 13/729,280, filed Dec. 28, 2012, US2013/0171388 A1, Pawlik et al.
U.S. Appl. No. 13/804,328, filed Mar. 14, 2013, US2013/0240799 A1, Haeger et al.
U.S. Appl. No. 13/649,616, filed Oct. 11, 2012, US2013/0092233 A1, Pawlik et al.
U.S. Appl. No. 14/077,750, filed Nov. 12, 2013, US2014/0141478 A1, Schaffer et al.
U.S. Appl. No. 14/132,473, filed Dec. 18, 2013, US2014/0178948 A1, Schaffer et al.
U.S. Appl. No. 14/649,414, filed Jun. 3, 2015, Schaffer et al.

\* cited by examiner

MULTILAYER FILM WITH POLYAMIDE AND POLYESTER LAYERS FOR THE PRODUCTION OF PHOTOVOLTAIC MODULES

CROSS REFERENCE TO RELATED APPLICATIONS

This application claims priority to DE 102011084518.6 filed Oct. 14, 2011, the disclosure of which is incorporated herein by reference in its entirety.

BACKGROUND OF THE INVENTION

The invention relates to the use of a multilayer film with polyamide and polyester layers for the production of solar modules.

Solar modules, frequently also referred to as photovoltaic modules, serve for electrical power generation from sunlight and consist of a laminate which comprises a solar cell system as the core layer. This core layer is encased with encapsulation materials which serve as protection against mechanical and weathering-related influences.

In conventional solar modules, the active solar cell is positioned between a front cover and a back cover. The front cover is transparent, generally consists of glass; and is bonded by means of an adhesion promoter layer which often contains an ethylene-vinyl acetate copolymer to the layer comprising the solar cell. The back cover provides electric shielding, serves as protection against weathering influences such as UV light and acts as a moisture barrier.

Film composites composed of fluoropolymer films and polyester may conventionally be employed as a back cover. The fluoropolymer film on the outside provides weathering resistance, while the polyester film is utilized to obtain mechanical stability and electrical insulation properties. A further fluoropolymer film on the inside serves for attachment to the sealing layer of the solar cell system. However, such fluoropolymer films have only low adhesion to the sealing layer which is used as embedding material for the solar cells themselves. In addition, the fluoropolymer film contributes to electrical insulation only to a minor degree, which results in the need to use a comparatively thick polyester film.

WO 2008138022 therefore proposes replacing the two fluoropolymer films in such composites with films of nylon-12 (PA12). In a development thereof, WO 2011066595 proposes that the solar cell-facing thermoplastic layer comprise a light-reflecting filler such as titanium dioxide, while the solar cell-remote thermoplastic layer comprise a second filler such as glass fibres, wollastonite or mica, which brings about a higher thermal conductivity of this layer. Illustrative thermoplastics come from the group of the polyamides, polyesters or blends of polyamide and polyolefin. Explicit mention is made of PA11, PA12 and PA1010, and blends thereof with polyolefins.

However, such thermoplastic combinations do not achieve sufficient adhesion of the layers, and particular mention should be made of the combination of polyesters and polyamides.

EP 1 065 048 A2 describes multilayer composites composed of incompatible polyamides and/or polyesters which are bonded to one another via an adhesion promoter layer. The adhesion promoter layer comprises a graft copolymer which consists of a polyamine moiety and grafted polyamide chains.

This document, however, does not demonstrate that the graft copolymer can also be used in a functional layer rather than in an adhesion promoter layer, and that it is also possible to improve the adhesion between layers comprising considerable amounts of fillers. Furthermore, this document also does not disclose the way in which the adhesion level changes over the course of years in the case of this specific application when a corresponding film is exposed to weathering.

SUMMARY OF THE INVENTION

It is therefore an object of the invention to provide a laminate film having improved adhesion between polyamide-based layers and layers comprising polyester.

Another object of this invention is to provide a laminate film of polyamide and polyester layers having effective filler content which is suitable as a backing film of a photovoltaic module.

A further object of the invention is to provide a photovoltaic module having improved stability of laminate polyamide and polyester layers.

It is another object of the invention to provide an adhesion-promoting solution for a multilayer film having polyamide and polyester layers, which ensures firm adhesion between the layers over the entire service life of the composite, i.e. over more than 20 years, regardless of all atmospheric effects.

These and other objects have been achieved by the present invention, the first embodiment of which includes a multilayer film, comprising, in the order listed:

a) a layer of a moulding composition which comprises at least 35% by weight, based on the overall layer moulding composition, of polyamide;

c) a layer of a moulding composition which comprises at least 35% by weight, based on the overall layer moulding composition, of a thermoplastic polyester;

e) a layer of a moulding composition which comprises at least 35% by weight, based on the overall moulding composition, of polyamide;

wherein the layers a) and e) further comprise 0.1 to 60% by weight, based on the respective moulding composition, of a polyamine-polyamide graft copolymer, or the layer c) further comprises 0.1 to 30% by weight, based on the moulding composition, of polyamine-polyamide graft copolymer;

with the proviso that the polyamine-polyamide graft copolymer comprises as copolymerized monomers:

0.5 to 25% by weight, based on the weight of the graft copolymer, of a polyamine having at least 4 nitrogen atoms and at least one polyamide-forming unit selected from the group consisting of a lactam, an ω-aminocarboxylic acid and an equimolar combinations of a diamine and a dicarboxylic acid.

In the layer a) which is a solar cell-facing layer the polyamide content is preferably at least 40% by weight, more preferably at least 45% by weight, especially preferably at least 50% by weight and most preferably at least 55% by weight, based in each case on the overall moulding composition, In the layer c) the content of the thermoplastic polyester is preferably at least 40% by weight, more preferably at least 45% by weight, especially preferably at least 50% by weight and most preferably at least 55% by weight, based in each case on the overall moulding composition, and In the layer e) the polyamide content is preferably at least 40% by weight, more preferably at least 45% by weight, especially preferably at least 50% by weight and most preferably at least 55% by weight, based in each case on the overall moulding composition.

The content of the polyamine-polyamide graft copolymer in the layer a) and/or the layer e) is preferably in each case 1 to 50% by weight and more preferably in each case 3 to 40% by weight, based on the respective moulding composition, of polyamine-polyamide graft copolymer.

The content of the polyamine-polyamide graft copolymer in the layer c) is preferably 1 to 20% by weight, based on the moulding composition.

In a preferred embodiment, the invention provides photovoltaic module, comprising;
a solar cell embedded in a sealing layer; and
the multilayer film according to the first embodiment as a back cover;
wherein the layer a) of the laminate film is bonded to the sealing layer.

In a second embodiment, the present invention provides a multilayer film, comprising, in the order listed:
a) a layer of a moulding composition which comprises at least 35% by weight, based on the overall layer moulding composition, of polyamide;
b) optionally, an adhesion promoter layer;
c) a layer of a moulding composition which comprises at least 35% by weight, based on the overall layer moulding composition, of a thermoplastic polyester;
d) optionally, an adhesion promoter layer; and
e) a layer of a moulding composition which comprises at least 35% by weight, based on the overall moulding composition, of polyamide;
wherein
at least one of layer b) or layer d) is present,
the at least one of layer b or d) comprises 60 to 100% by weight of:
0.1 to 100% by weight of a polyamine-polyamide graft copolymer,
0 to 99.9% by weight of a polyamide and
0 to 99.9% by weight of a thermoplastic polyester,
with the proviso that the polyamine-polyamide graft copolymer comprises as copolymerized monomers:
0.5 to 25% by weight, based on the weight of the graft copolymer, of a polyamine having at least 4 nitrogen atoms and
at least one polyamide-forming unit selected from the group consisting of a lactam, an ω-aminocarboxylic acid and an equimolar combinations of a diamine and a dicarboxylic acid.

In the layer a) which is a solar cell-facing layer the polyamide content is preferably at least 40% by weight, more preferably at least 45% by weight, especially preferably at least 50% by weight and most preferably at least 55% by weight, based in each case on the overall moulding composition, In the layer c) the content of the thermoplastic polyester is preferably at least 40% by weight, more preferably at least 45% by weight, especially preferably at least 50% by weight and most preferably at least 55% by weight, based in each case on the overall moulding composition, and In the layer e) the polyamide content is preferably at least 40% by weight, more preferably at least 45% by weight, especially preferably at least 50% by weight and most preferably at least 55% by weight, based in each case on the overall moulding composition.

In the adhesion promoying layers the content of the polyamine-polyamide graft copolymer is preferably 1 to 75% by weight, more preferably 3 to 50% by weight and especially preferably 4 to 40% by weight.

In the adhesion promoying layers the content of the polyamide is preferably 12.5 to 99% by weight, more preferably 25 to 97% by weight and especially preferably 30 to 96% by weight.

In the adhesion promoying layers the content of the thermoplastic polyester is preferably 12.5 to 99% by weight, more preferably 25 to 97% by weight and especially preferably 30 to 96% by weight.

In the adhesion promoying layers the content of the additives selected from impact-modifying rubber and standard assistants and admixtures is preferably 0.1 to 30% by weight.

In the adhesion promoying layers the content of the polyamine in the polyamine-polyamide graft copolymer is preferably 1 to 20% by weight and more preferably 1.5 to 16% by weight, based on the graft copolymer.

In another preferred embodiment the present invention provides a photovoltaic module, comprising;
a solar cell embedded in a sealing layer; and
the multilayer film according to the second embodiment as a back cover;
wherein the layer a) of the laminate film is bonded to the sealing layer.

DETAILED DESCRIPTION OF THE INVENTION

The first embodiment of the invention provides a multilayer film, comprising, in the order listed:
a) a layer of a moulding composition which comprises at least 35% by weight, based on the overall layer moulding composition, of polyamide;
c) a layer of a moulding composition which comprises at least 35% by weight, based on the overall layer moulding composition, of a thermoplastic polyester;
e) a layer of a moulding composition which comprises at least 35% by weight, based on the overall moulding composition, of polyamide;
wherein
the layers a) and e) further comprise 0.1 to 60% by weight, based on the respective moulding composition, of a polyamine-polyamide graft copolymer, or
the layer c) further comprises 0.1 to 30% by weight, based on the moulding composition, of polyamine-polyamide graft copolymer;
with the proviso that the polyamine-polyamide graft copolymer comprises as copolymerized monomers:
0.5 to 25% by weight, based on the weight of the graft copolymer, of a polyamine having at least 4 nitrogen atoms and
at least one polyamide-forming unit selected from the group consisting of a lactam, an ω-aminocarboxylic acid and an equimolar combinations of a diamine and a dicarboxylic acid.

In the layer a) which is a solar cell-facing layer the polyamide content is preferably at least 40% by weight, more preferably at least 45% by weight, especially preferably at least 50% by weight and most preferably at least 55% by weight, based in each case on the overall moulding composition, In the layer c) the content of the thermoplastic polyester is preferably at least 40% by weight, more preferably at least 45% by weight, especially preferably at least 50% by weight and most preferably at least 55% by weight, based in each case on the overall moulding composition, and In the layer e) the polyamide content is preferably at least 40% by weight, more preferably at least 45% by weight, especially preferably at least 50% by weight and most preferably at least 55% by weight, based in each case on the overall moulding composition.

The content of the polyamine-polyamide graft copolymer in the layer a) and/or the layer e) is preferably in each case 1 to 50% by weight and more preferably in each case 3 to 40% by weight, based on the respective moulding composition, of polyamine-polyamide graft copolymer.

The content of the polyamine-polyamide graft copolymer in the layer c) is preferably 1 to 20% by weight, based on the moulding composition.

In a preferred embodiment, the invention provides a photovoltaic module, comprising;
a solar cell embedded in a sealing layer; and
the multilayer film according to the first embodiment as a back cover;
wherein the layer a) of the laminate film is bonded to the sealing layer.

In a second embodiment, the present invention provides a multilayer film, comprising, in the order listed:
a) a layer of a moulding composition which comprises at least 35% by weight, based on the overall layer moulding composition, of polyamide;
b) optionally, an adhesion promoter layer;
c) a layer of a moulding composition which comprises at least 35% by weight, based on the overall layer moulding composition, of a thermoplastic polyester;
d) optionally, an adhesion promoter layer; and
e) a layer of a moulding composition which comprises at least 35% by weight, based on the overall moulding composition, of polyamide;
wherein
at least one of layer b) or layer d) is present,
the at least one of layer b or d) comprises 60 to 100% by weight of:
  0.1 to 100% by weight of a polyamine-polyamide graft copolymer,
  0 to 99.9% by weight of a polyamide and
  0 to 99.9% by weight of a thermoplastic polyester,
  with the proviso that the polyamine-polyamide graft copolymer comprises as copolymerized monomers:
    0.5 to 25% by weight, based on the weight of the graft copolymer, of a polyamine having at least 4 nitrogen atoms and
    at least one polyamide-forming unit selected from the group consisting of a lactam, an ω-aminocarboxylic acid and an equimolar combinations of a diamine and a dicarboxylic acid.

In the layer a) which is a solar cell-facing layer the polyamide content is preferably at least 40% by weight, more preferably at least 45% by weight, especially preferably at least 50% by weight and most preferably at least 55% by weight, based in each case on the overall moulding composition, In the layer c) the content of the thermoplastic polyester is preferably at least 40% by weight, more preferably at least 45% by weight, especially preferably at least 50% by weight and most preferably at least 55% by weight, based in each case on the overall moulding composition, and In the layer e) the polyamide content is preferably at least 40% by weight, more preferably at least 45% by weight, especially preferably at least 50% by weight and most preferably at least 55% by weight, based in each case on the overall moulding composition.

In the adhesion promoying layers the content of the polyamine-polyamide graft copolymer is preferably 1 to 75% by weight, more preferably 3 to 50% by weight and especially preferably 4 to 40% by weight.

In the adhesion promoying layers the content of the polyamide is preferably 12.5 to 99% by weight, more preferably 25 to 97% by weight and especially preferably 30 to 96% by weight.

In the adhesion promoying layers the content of the thermoplastic polyester is preferably 12.5 to 99% by weight, more preferably 25 to 97% by weight and especially preferably 30 to 96% by weight.

In the adhesion promoying layers the content of the additives selected from impact-modifying rubber and standard assistants and admixtures is preferably 0.1 to 30% by weight.

In the adhesion promoying layers the content of thepolyamine in the polyamine-polyamide graft copolymer is preferably 1 to 20% by weight and more preferably 1.5 to 16% by weight, based on the graft copolymer.

In another preferred embodiment the present invention provides A photovoltaic module, comprising;
a solar cell embedded in a sealing layer; and
the multilayer film according to the second embodiment as a back cover;
wherein the layer a) of the laminate film is bonded to the sealing layer.

Thus, various arrangements of the invention may be as follows:

In one arrangement, the multilayer film comprises, in direct succession, the layers a), c) and e). Both the moulding composition of the layer a) and the moulding composition of the layer e) comprise the polyamine-polyamide graft copolymer as described.

In a second arrangement, the multilayer film comprises, in direct succession, the layers a), c) and e). The moulding composition of the layer c) comprises the polyamine-polyamide graft copolymer as described above.

In a third arrangement, the multilayer film comprises, in direct succession, the layers a), b), c), d) and e). The layers b) and d) are adhesion promoter layers having a composition as described above.

In a fourth arrangement, the multilayer film comprises, in direct succession, the layers a), c), d) and e). The moulding composition of the layer according to a) comprises the amount of polyamine-polyamide graft copolymer as described above. The layer according to d) is an adhesion promoter layer having a composition as described above.

In a fifth arrangement, the multilayer film comprises, in direct succession, the layers a), b), c) and e). The moulding composition of the layer e) comprises the amount of polyamine-polyamide graft copolymer described above. The layer b) is an adhesion promoter layer having a composition as described above.

Unless stated otherwise, the further details which follow may apply equally to all these arrangements.

The polyamide may be a partly crystalline polyamide, for example PA6, PA66, PA610, PA612, PA10, PA810, PA106, PA1010, PA11, PA1011, PA1012, PA1210, PA1212, PA814, PA1014, PA618, PA512, PA613, PA813, PA914, PA1015, PA11, PA12, or a semiaromatic polyamide, called a polyphthalamide (PPA). (The naming of the polyamides corresponds to the international standard, the first number(s) giving the number of carbon atoms of the starting diamine and the last number(s) the number of carbon atoms of the dicarboxylic acid. If only one number is mentioned, this means that the starting material was an α,ω-aminocarboxylic acid or the lactam derived therefrom; for the rest, reference is made to H. Domininghaus, Die Kunststoffe und ihre Eigenschaften [The polymers and their properties], pages 272 ff., VDI-Verlag, 1976.) Suitable PPAs are, for example, PA66/6T, PA6/6T, PA6T/MPMDT (MPMD stands for 2-methylpentamethylenediamine), PA9T, PA10T, PA11T, PA12T, PA14T and copolycondensates of these latter types with an aliphatic diamine and an aliphatic dicarboxylic acid or with an w-aminocarboxylic acid or a lactam. Partly crystalline polyamides have an enthalpy of fusion of more than 25 J/g, measured by the DSC method to ISO 11357 in the 2nd heating step and integration of the melt peak.

The polyamide may also be a semicrystalline polyamide. Semicrystalline polyamides have an enthalpy of fusion of 4 to 25 J/g, measured by the DSC method to ISO 11357 in the 2nd heating step and integration of the melt peak. Examples of suitable semicrystalline polyamides are The polyamide of 1,10-decanedioic acid or 1,12-dodecanedioic acid and 4,4'-diaminodicyclohexylmethane (PA PACM10 and PA PACM12), proceeding from a 4,4'-diaminodicyclohexylmethane with a trans,trans isomer content of 35 to 65%;

copolymers based on the abovementioned partly crystalline polyamides; and blends of the abovementioned partly crystalline polyamides and a compatible amorphous polyamide.

The polyamide may also be an amorphous polyamide. Amorphous polyamides have an enthalpy of fusion of less than 4 J/g, measured by the DSC method to ISO 11357 in the 2nd heating step and integration of the melt peak. Examples of amorphous polyamides are:

the polyamide of terephthalic acid and/or isophthalic acid and the isomer mixture of 2,2,4- and 2,4,4-trimethylhexamethylenediamine, the polyamide of isophthalic acid and 1,6-hexamethylenediamine, the copolyamide of a mixture of terephthalic acid/isophthalic acid and 1,6-hexamethylenediamine, optionally in a mixture with 4,4'-diaminodicyclohexylmethane, the copolyamide of terephthalic acid and/or isophthalic acid, 3,3'-dimethyl-4,4'-diaminodicyclohexylmethane and laurolactam or caprolactam, the (co)polyamide of 1,12-dodecanedioic acid or sebacic acid, 3,3'-dimethyl-4,4'-diaminodicyclohexylmethane, and optionally lauro-lactam or caprolactam, the copolyamide of isophthalic acid, 4,4'-diaminodicyclohexylmethane and laurolactam or caprolactam, the polyamide of 1,12-dodecanedioic acid and 4,4'-diaminodicyclohexylmethane (in the case of a low trans, trans isomer content), the (co)polyamide of terephthalic acid and/or isophthalic acid and an alkyl-substituted bis(4-aminocyclohexyl)methane homologue, optionally in a mixture with hexamethylenediamine, the copolyamide of bis(4-amino-3-methyl-5-ethylcyclohexyl)methane, optionally together with a further diamine, and isophthalic acid, optionally together with a further dicarboxylic acid, the copolyamide of a mixture of m-xylylenediamine and a further diamine, e.g. hexamethylenediamine, and isophthalic acid, optionally together with a further dicarboxylic acid, for example terephthalic acid and/or 2,6-naphthalenedicarboxylic acid, the copolyamide of a mixture of bis(4-aminocyclohexyl)methane and bis(4-amino-3-methylcyclohexyl)methane, and aliphatic dicarboxylic acids having 8 to 14 carbon atoms, and polyamides or copolyamides of a mixture comprising 1,14-tetradecanedioic acid and an aromatic, arylaliphatic or cycloaliphatic diamine.

These examples may be varied to a very substantial degree by addition of further components (for example caprolactam, laurolactam or diamine/dicarboxylic acid combinations) or by partial or full replacement of starting components by other components.

The polyamide may also be a polyetheresteramide or a polyetheramide. Polyetheresteramides are described, for example, in DE-A-25 23 991 and DE-A-27 12 987; they contain a polyether diol as a comonomer. Polyetheramides are described, for example, in DE-A-30 06 961; they contain a polyether diamine as a comonomer.

In the polyether diol or the polyether diamine, the polyether unit may be based, for example, on 1,2-ethanediol, 1,2-propanediol, 1,3-propanediol, 1,4-butanediol or 1,3-butanediol. The polyether unit may also be of mixed structure, for instance with random or blockwise distribution of the units originating from the diols. The weight-average molar mass of the polyether diols or polyether diamines may be 200 to 5000 g/mol and preferably 400 to 3000 g/mol; the proportion thereof in the polyetheresteramide or polyetheramide may preferably be 4 to 60% by weight and more preferably 10 to 50% by weight. Suitable polyether diamines are obtainable by conversion of the corresponding polyether diols by reductive amination or coupling to acrylonitrile with subsequent hydrogenation; they are commercially available, for example, in the form of the JEFFAMINE® D or ED products or of the ELASTAMINE® products from Huntsman Corp., or in the form of the Polyetheramine D series from BASF SE. It may also be possible to additionally use smaller amounts of a polyether triamine, for example a JEFFAMINE® T product, if a branched polyetheramide is to be used. Preference is given to using polyether diamines or polyether triamines which contain an average of at least 2.3 carbon atoms in the chain per ether oxygen atom. According to the invention, polyetheramides are preferred due to better hydrolysis resistance.

Useful thermoplastic polyesters include linear thermoplastic polyesters. These may be prepared by polycondensation of diols with dicarboxylic acid or polyester-forming derivatives thereof such as dimethyl esters. Suitable diols may have the formula HO—R—OH where R is a divalent branched or unbranched aliphatic and/or cycloaliphatic radical having 2 to 40 and preferably 2 to 12 carbon atoms. Suitable dicarboxylic acids may have the formula HOOC—R'13 COOH where R' is a divalent aromatic radical having 6 to 20 and preferably 6 to 12 carbon atoms.

Examples of diols include ethylene glycol, trimethylene glycol, tetramethylene glycol, hexamethylene glycol, neopentyl glycol, cyclohexanedimethanol, and the C36 diol dimer diol. The diols can be used alone or as a diol mixture. Up to 25 mol % of the diol mentioned may be replaced by a polyalkylene glycol of the formula:

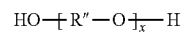

wherein R" is a divalent radical having 2 to 4 carbon atoms and x is a value from 2 to 50.

Examples of useful aromatic dicarboxylic acids include terephthalic acid, isophthalic acid, 1,4-, 1,5-, 2,6- or 2,7-naphthalenedicarboxylic acid, diphenic acid and diphenyl ether 4,4'-dicarboxylic acid. Up to 30 mol % of these dicarboxylic acids may be replaced by aliphatic or cycloaliphatic dicarboxylic acids, for example succinic acid, adipic acid, sebacic acid, dodecanedioic acid or cyclohexane-1,4-dicarboxylic acid.

Examples of suitable polyesters include polyethylene terephthalate, polypropylene terephthalate, polybutylene terephthalate, polyethylene 2,6-naphthalate, polypropylene 2,6-naphthalate and polybutylene 2,6-naphthalate.

The preparation of these polyesters is described in DE-A 24 07 155, 24 07 156; Ullmanns Encyclopädie der technischen Chemie, 4th ed., Vol. 19, pages 65 ff., Verlag Chemie, Weinheim, 1980).

The polyamines used in the polyamine-polyamide graft copolymer may, for example, be the following substance classes:
  polyvinylamines (Rompp Chemie Lexikon, 9th edition, volume 6, page 4921, Georg Thieme Verlag Stuttgart 1992)
  polyamines which are prepared from alternating polyketones (DE-A 196 54 058)
  dendrimers, for example
  ((H2N—(CH2)3)2N—(CH2)3)2-N(CH2)2-N((CH2)2-N((CH2)3-NH2)2)2 (DE-A-196 54 179) or
  tris(2-aminoethyl)amine, N,N-bis(2-aminoethyl)-N,N'-bis[2-[bis(2-aminoethyl)amino]ethyl]-1,2-ethanediamine, 3,15-bis(2-aminoethyl)-6,12-bis[2-[bis(2-aminoethyl)amino]ethyl]-9-[2-[bis[2-bis(2-aminoethyl)amino]ethyl]amino]ethyl]-3,6,9,12,15-pentaazaheptadecane-1,17-diamine (J. M. Warakomski, Chem. Mat. 1992, 4, 1000-1004);
  linear polyethyleneimines which can be prepared by polymerization of 4,5-dihydro-1,3-oxazoles and subsequent hydrolysis (Houben-Weyl, Methoden der Organischen Chemie [Methods of Organic Chemistry], Volume E20, pages 1482-1487, Georg Thieme Verlag Stuttgart, 1987);
  branched polyethyleneimines which are obtainable by polymerization of aziridines (Houben-Weyl, Methoden der Organischen Chemie, Volume E20, pages 1482-1487, Georg Thieme Verlag Stuttgart, 1987) and which generally have the following amino group distribution:
  25 to 46% primary amino groups,
  30 to 45% secondary amino groups and
  16 to 40% tertiary amino groups.

In a preferred case, the polyamine may have a number-average molecular weight Mn not exceeding 20 000 g/mol, more preferably not exceeding 10 000 g/mol and especially preferably not exceeding 5 000 g/mol.

Lactams or co-aminocarboxylic acids which may be used as polyamide-forming monomers contain 4 to 19 and especially 6 to 12 carbon atoms. Particular preference may be given to using caprolactam, w-aminocaproic acid, caprylolactam, co-aminocaprylic acid, laurolactam, co-aminododecanoic acid and/or co-aminoundecanoic acid.

Combinations of diamine and dicarboxylic acid may be, for example, hexamethylenediamine/adipic acid, hexamethylenediamine/dodecanedioic acid, octamethylenediamine/sebacic acid, decamethylenediamine/sebacic acid, decamethylenediamine/dodecanedioic acid, dodecamethylenediamine/dodecanedioic acid and dodecamethylenediamine/2,6-naphthalenedicarboxylic acid. In addition, it may also be possible to use all other combinations, such as decamethylenediamine/dodecanedioic acid/terephthalic acid, hexamethylenediamine/adipic acid/terephthalic acid, hexamethylenediamine/adipic acid/caprolactam, decamethylenediamine/dodecanedioic acid/co-aminoundecanoic acid, decamethylenediamine/dodecanedioic acid/laurolactam, decamethylenediamine/terephthalic acid/laurolactam or dodecamethylenediamine/2,6-naphthalenedicarboxylic acid/laurolactam.

In a preferred embodiment, the graft copolymer may additionally be prepared using an oligocarboxylic acid selected from 0.015 to about 3 mol % of dicarboxylic acid and 0.01 to about 1.2 mol % of tricarboxylic acid, based in each case on the sum of the rest of the polyamide-forming monomers. On this basis, each of these monomers is considered individually in the equivalent combination of diamine and dicarboxylic acid. In this way, the polyamide-forming monomers overall have a slight excess of carboxyl groups. When a dicarboxylic acid is used, preferably 0.03 to 2.2 mol %, more preferably 0.05 to 1.5 mol %, even more preferably 0.1 to 1 mol % and especially 0.15 to 0.65 mol % is added; if a tricarboxylic acid is used, preferably 0.02 to 0.9 mol %, more preferably 0.025 to 0.6 mol %, even more preferably 0.03 to 0.4 mol % and especially 0.04 to 0.25 mol % is taken. The additional use of the oligocarboxylic acid distinctly improves hydrolysis resistance and stress-cracking resistance.

The oligocarboxylic acid used may be any desired di- or tricarboxylic acid having 6 to 24 carbon atoms, for example adipic acid, suberic acid, azelaic acid, sebacic acid, dodecanedioic acid, isophthalic acid, 2,6-naphthalenedicarboxylic acid, cyclohexane-1,4-dicarboxylic acid, trimesic acid and/or trimellitic acid.

In addition, if desired, aliphatic, alicyclic, aromatic, aralkylic and/or alkylaryl-substituted monocarboxylic acids having 3 to 50 carbon atoms, for example lauric acid, unsaturated fatty acids, acrylic acid or benzoic acid, can be used as regulators. These regulators can be used to reduce the concentration of amino groups without altering the molecular skeleton. In addition, it is possible in this way to introduce functional groups such as double or triple bonds etc. It is, however, desirable that the graft copolymer has a substantial proportion of amino groups. In a preferred embodiment, the amino group concentration of the graft copolymer may be in the range from 100 to 2500 mmol/kg, more preferably in the range from 150 to 1500 mmol/kg, especially preferably in the range from 250 to 1300 mmol/kg and most preferably in the range from 300 to 1100 mmol/kg. Amino groups are understood here and hereinafter to mean not just amino end groups but also any secondary or tertiary amino functions present in the polyamine.

The inventive graft copolymers may be prepared by various processes.

One option may be to initially charge lactam or co-aminocarboxylic acid and polyamine together and to conduct the polymerization or the polycondensation. The oligocarboxylic acid may be added either at the start or in the course of the reaction.

However, a preferred process involves, in a two-stage process, first conducting the lactam cleavage and prepolymerization in the presence of water (alternatively, the corresponding ω-aminocarboxylic acids or diamines and dicarboxylic acids are used directly and prepolymerized); in the second step, the polyamine is added, while any oligocarboxylic acid additionally used is metered in before, during or after the prepolymerization. Then the mixture is decompressed at temperatures between 200 and 290° C. and polycondensed in a nitrogen stream or under reduced pressure.

A further preferred process involves the hydrolytic degradation of a polyamide to a prepolymer and simultaneous or subsequent reaction with the polyamine. Preference is given to using polyamides in which the end group difference is approximately zero, or in which any oligocarboxylic acid additionally used has already been incorporated by polycondensation. The oligocarboxylic acid can also be added at the start of or in the course of the degradation reaction. These processes may be used to prepare ultrahighly branched polyamides with acid numbers less than 40 mmol/kg, preferably less than 20 mmol/kg and more preferably less than 10 mmol/kg. Even after a reaction time of one to five hours at temperatures of 200° C. to 290° C., virtually full conversion is achieved.

If desired, in a further process step, a vacuum phase lasting several hours may follow. This lasts at least four hours, preferably at least six hours and more preferably at least eight hours at 200 to 290° C. After an induction period of several hours, an increase in the melt viscosity is then observed, which may be attributable to the fact that a reaction of amino end groups with one another takes place with elimination of ammonia and chain linkage. As a result, the molecular weight is increased further, which is advantageous especially for extrusion moulding compositions.

If the intention is not to conduct the reaction to completion in the melt, the ultrahighly branched polyamide may also be postcondensed in solid phase as conventionally known.

The moulding composition of the layer according to a) may comprise either one of the abovementioned polyamides or a plurality thereof as a mixture. In addition, up to 40% by weight, based on the total polymer content of the moulding composition, of other thermoplastics may be present, for example impact-modifying rubbers or polyolefins such as polyethylene or polypropylene. Any rubbers or polyolefins present preferably comprise, as known to one of skill in the art, functional groups with which compatibility with the polyamide matrix may be obtained. In addition, the assistants and additives customary for polyamides may be present, especially light and/or heat stabilizers, or preferably also light-reflecting fillers, for example titanium dioxide (WO 2011066595).

The moulding composition of the layer c) may comprise either one of the abovementioned polyesters or a plurality thereof as a mixture. In addition, up to 50% by weight and preferably up to 40% by weight, based in each case on the overall polymer content of the moulding composition, of other thermoplastics may be present, for example impact-modifying rubbers or polyolefins such as polyethylene or polypropylene, or polyamine-polyamide graft copolymer. Any rubbers or polyolefins present preferably comprise functional groups to improve matrix compatibility; additionally or alternatively thereto, it may be possible to add a compatibilizer. In addition, the assistants and additives customary for polyester may be present, especially light and/or heat stabilizers, light-reflecting fillers, for example titanium dioxide, and reinforcing fillers, for example glass fibres, wollastonite or mica.

For the moulding composition of the layer e), the same applies as for the moulding composition of the layer according to a), and also, with regard to fillers, the same as for the moulding composition of the layer c). In addition, the moulding composition of the layer e) may be coloured and/or have a matting agent.

The individual film layers may have the following thicknesses:

layers a) and e): 15 to 100 µm and preferably 25 to 50 µm;
layer c): 100 to 500 µm and preferably 150 to 400 µm;
layers b) and d): 3 to 40 µm and preferably 5 to 25 µm.

The multilayer film used in accordance with the invention may be produced by all conventionally known methods, for example coextrusion or lamination. The film may be bonded to the sealing layer into which the solar cell is embedded, for example, by lamination or adhesive bonding. Due to the polyamide content in the layer a), good adhesion to the sealing layer may be obtained in the case of lamination. The sealing layer used may be any material commonly used in the art.

The present invention also provides a photovoltaic module which has been produced using the multilayer film according to the embodiments and arrangements.

Having generally described this invention, a further understanding can be obtained by reference to certain specific examples which are provided herein for purposes of illustration only, and are not intended to be limiting unless otherwise specified.

EXAMPLES

The moulding compositions which follow were produced; "parts" are always parts by weight.

Compound 1 for Outer Layers:

79.25 parts of VESTAMID® L1901 nf (PA12), 0.5 part of IRGANOX® 1098 (a sterically hindered phenolic antioxidant), 0.2 part of TINUVIN® 312 (UV absorber) and 20 parts of the titanium dioxide Sachtleben R 420 were mixed with the aid of a twin-screw extruder (Coperion Werner & Pfleiderer ZSK 25 WLE, 36 L/D) at a barrel temperature of 220° C. The extrudate was cooled with the aid of a water bath and chopped; the pellets were subsequently dried in a forced-air oven at 80° C. for 12 hours.

Compound 2 for Outer Layers:

69.25 parts of VESTAMID® L1901 nf, 10 parts of polyamine-polyamide graft copolymer (prepared according to EP 1 065 236 A2 from 87.063% by weight of laurolactam, 0.164% by weight of dodecanedioic acid, 8.205% by weight of 50% Lupasol® G 100, 0.010% by weight of 50% hypophosphorous acid and 4.558% by weight of demineralized water), 0.5 part of IRGANOX® 1098, 0.2 part of TINUVIN® 312 and 20 parts of the titanium dioxide Sachtleben R 420 were mixed with the aid of a twin-screw extruder (Coperion Werner & Pfleiderer ZSK 25 WLE, 36 L/D) at a barrel temperature of 220° C. The extrudate was cooled with the aid of a water bath and chopped; the pellets were subsequently dried in a forced-air oven at 80° C. for 12 hours.

Compound 3 for Middle Layer:

35.5 parts of VESTAMID® L1901 nf, 44.0 parts of VESTODUR® 3000 (PBT), 20 parts of TEC 110 kaolin, 0.25 part of IRGAFOS® 168 (processing stabilizer) and 0.25 part of IRGANOX® 1010 (sterically hindered phenolic antioxidant) were mixed with the aid of a twin-screw extruder (Coperion Werner & Pfleiderer ZSK 25 WLE, 36 L/D) at a barrel temperature of 260° C. The extrudate was cooled with the aid of a water bath and chopped; the pellets were subsequently dried in a forced-air oven at 80° C. for 12 hours.

Compound 4 for Middle Layer:

26.5 parts of VESTAMID® L1901, 9.0 parts of the same polyamine-polyamide graft copolymer as in Compound 2, 44.0 parts of VESTODUR® 3000, 20 parts of TEC 110 kaolin, 0.25 part of IRGAFOS® 168 and 0.25 part of IRGANOX® 1010 were mixed with the aid of a twin-screw extruder (Coperion Werner & Pfleiderer ZSK 25 WLE, 36

L/D) at a barrel temperature of 260° C. The extrudate was cooled with the aid of a water bath and chopped; the pellets were subsequently dried in a forced-air oven at 80° C. for 12 hours.

Compound 5 for Adhesion Promoter Layer:

51.6 parts of VESTODUR® 3000, 9.0 parts of EXX-ELOR® VA 1803 (a maleic anhydride-functionalized ethylene-propylene rubber), 26.0 parts of VESTAMID® ZA7295nf (PA12 extrusion type), 13.4 parts of the same polyamine-polyamide graft copolymer as in Compound 2, 0.25 part of IRGAFOS® 168 and 0.25 part of IRGANOX® 1010 were mixed with the aid of a twin-screw extruder (Coperion Werner & Pfleiderer ZSK 25 WLE, 36 L/D) at a barrel temperature of 260° C. The extrudate was cooled with the aid of a water bath and chopped; the pellets were subsequently dried in a forced-air oven at 80° C. for 12 hours.

Extrusion of Multilayer Films:

A multilayer film system from Collin (300 mm slot die, gap width 0-6 mm, co-extrusion feed block for 3-layer or 5-layer films) was used to produce three- and five-layer films (processing temperature for middle layer and adhesion promoter layers approx. 260° C., and for outer layers approx. 230° C.). The layer thickness distribution was set as follows:

a/c/e: 50 μm/250 μm/50 μm
a/b/c/d/e: 50 μm/10 μm/230 μm/10 μm/50 μm

The results are shown in Table 1.

TABLE 1

Examples

| | Layer structure | Interlaminar adhesion [N/mm] |
|---|---|---|
| Comparative Example | Compound 1/Compound 3/Compound 1 | 0.3 |
| Example 1 | Compound 2/Compound 3/Compound 2 | Separation impossible |
| Example 2 | Compound 1/Compound 4/Compound 1 | Separation impossible |
| Example 3 | Compound 1/Compound 5/Compound 3/ Compound 5/Compound 1 | Separation impossible |

Numerous modifications and variations on the present invention are possible in light of the above description. It is therefore to be understood that within the scope of the appended claims, the invention may be practiced otherwise than as specifically described herein.

The invention claimed is:

1. A multilayer film, comprising, in the order listed:
a) a first layer of from 15 to 100 μm in thickness having a composition which comprises a light reflecting filler and at least 35% by weight of polyamide based on the weight of the composition of the first layer;
c) a second layer of from 100 to 500 μm in thickness having a composition which comprises a polyamide, at least one of a reinforcing filler and a light reflecting filler and at least 35% by weight of a thermoplastic polyester based on the weight of the composition of the second layer;
e) a third layer of from 15 to 100 μm in thickness having a composition which comprises at least one of a reinforcing filler and a light reflecting filler and at least 35% by weight of polyamide based on the weight of the composition of the third layer;

wherein
the thickness of the first layer is independent of the thickness of the third layer, the compositions of the first and third layers each further comprise 0.1 to 60% by weight of a polyamine-polyamide graft copolymer, or the composition of the second layer further comprises 0.1 to 30% by weight of polyamine-polyamide graft copolymer;

with the proviso that the polyamine-polyamide graft copolymer comprises as copolymerized monomers:

0.5 to 25% by weight, based on the weight of the graft copolymer, of a polyamine having at least 4 nitrogen atoms and at least one polyamide-forming unit selected from the group consisting of a lactam, an ω-aminocarboxylic acid and an equimolar combination of a diamine and a dicarboxylic acid.

2. The multilayer film according to claim 1 wherein the thermoplastic polyester of the second layer is a linear polyester comprising polycondensed diols and dicarboxylic acids or polyester-forming derivatives thereof wherein the diol is of formula

HO—R—OH wherein R is a divalent branched or unbranched aliphatic and/or cycloaliphatic radical having 2 to 40 carbon atoms, and the dicarboxylic acid is of formula

HOOC—R'—COOH wherein R' is a divalent aromatic radical having 6 to 20 carbon atoms.

3. The multilayer film according to claim 1, wherein the polyamide present in at least 35% of each of the first and third layers comprises independently one selected from the group consisting of a partly crystalline polyamide having an enthalpy of fusion of more than 25 J/g, a semicrystalline polyamide having an enthalpy of fusion of from 4 to 25 J/g and an amorphous polyamide having an enthalpy of fusion of less than 4 J/g.

4. The multilayer film according to claim 1 wherein the polyamide present in at least 35% of the first layer, the polyamide present in at least 35% of the third layer or both the polyamides present in at least 35% of the first layer and the third layer comprises at least one of a polyetheresteramide and a polyetheramide.

5. A photovoltaic module, comprising;
a solar cell embedded in a sealing layer; and
the multilayer film according to claim 1 as a back cover;
wherein the first layer of the multilayer film is bonded to the sealing layer.

6. The photovoltaic module according to claim 5, wherein at least one of the first layer, the third layer and the second layer further comprises an impact-modifying rubber optionally modified with a polyamide compatible functional group.

7. The multilayer film of claim 1, further comprising:
b) optionally, an adhesion promoter layer between the first and second layer; and
d) optionally, an adhesion promoter layer between the second and third layer;

wherein
at least one adhesion promoter layer is present, and comprises:
0.1 to 100% by weight of a polyamine-polyamide graft copolymer,
0 to 99.9% by weight of a polyamide and
0 to 99.9% by weight of a thermoplastic polyester,
with the proviso that the polyamine-polyamide graft copolymer comprises as copolymerized monomers:

0.5 to 25% by weight, based on the weight of the graft copolymer, of a polyamine having at least 4 nitrogen atoms and at least one polyamide-forming unit selected from the group consisting of a lactam, an ω-aminocarboxylic acid and an equimolar combinations of a diamine and a dicarboxylic acid.

8. The multilayer film according to claim 7, wherein the polyamine of the graft copolymer is one selected from the group consisting of a polyvinylamine, a polyamine prepared from an alternating polyketone, a dendrimer, a linear polyethyleneimine, and a branched polyethyleneimine.

9. The multilayer film according to claim 8 wherein a number average molecular weight of the polyamine is not greater than 20,000 g/mol.

10. A photovoltaic module, comprising;

a solar cell embedded in a sealing layer; and the multilayer film according to claim 7 as a back cover; wherein the first layer of the laminate film is bonded to the sealing layer.

11. The multilayer film of claim 1, wherein at least one of the second layer c) and the third layer e) comprise a reinforcing filler.

12. The multilayer film of claim 1, wherein the second layer c) and the third layer e) comprise a reinforcing filler.

13. The multilayer film of claim 1, wherein at least one of the second layer c) and the third layer e) comprise a reinforcing filler and the reinforcing filler is glass fibers.

14. The multilayer film of claim 1, wherein the second layer c) and the third layer e) comprise a reinforcing filler and the reinforcing filler is glass fibers.

* * * * *